(12) United States Patent
Kim et al.

(10) Patent No.: US 11,490,506 B2
(45) Date of Patent: Nov. 1, 2022

(54) SKEW COMPENSATION APPARATUS FOR CONTROLLING TRANSMISSION LINE IMPEDANCE

(71) Applicant: HEWLETT PACKARD ENTERPRISE DEVELOPMENT LP, Spring, TX (US)

(72) Inventors: Hyunjun Kim, Seattle, WA (US); Andrew J. Becker, Chippewa Falls, WI (US); Paul Taylor Wildes, Chippewa Falls, WI (US); Gregory E. Scott, Seattle, WA (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 0 days.

(21) Appl. No.: 16/880,944

(22) Filed: May 21, 2020

(65) Prior Publication Data
US 2020/0375025 A1 Nov. 26, 2020

Related U.S. Application Data

(60) Provisional application No. 62/852,283, filed on May 23, 2019.

(51) Int. Cl.
*H05K 1/02* (2006.01)
*H01P 3/08* (2006.01)

(52) U.S. Cl.
CPC ............. *H05K 1/0237* (2013.01); *H01P 3/08* (2013.01)

(58) Field of Classification Search
CPC .................................. H05K 1/0237; H01P 3/08
See application file for complete search history.

(56) References Cited

U.S. PATENT DOCUMENTS

| 8,835,775 | B2 * | 9/2014 | Fan | H05K 1/0248 |
| | | | | 174/250 |
| 9,750,130 | B2 * | 8/2017 | Ito | H04L 25/0272 |
| 10,485,096 | B2 * | 11/2019 | Chandra | H05K 1/0245 |
| 2011/0203834 | A1 * | 8/2011 | Yoneya | H05K 1/025 |
| | | | | 174/250 |
| 2019/0261505 | A1 * | 8/2019 | Mutnury | H05K 1/0228 |
| 2020/0267833 | A1 * | 8/2020 | Lou | H01P 3/08 |

* cited by examiner

*Primary Examiner* — Samuel S Outten

(57) ABSTRACT

One embodiment provides a printed circuit board (PCB). The PCB can include one or more metal layers and at least a pair of differential transmission lines. The pair of differential transmission lines can include a first transmission line and a second transmission line. The first transmission line can include a plurality of timing-skew-compensation structures, and a respective timing-skew-compensation structure of the first transmission line or a corresponding segment of the second transmission line adjacent to the timing-skew-compensation structure has a non-uniform width.

18 Claims, 14 Drawing Sheets

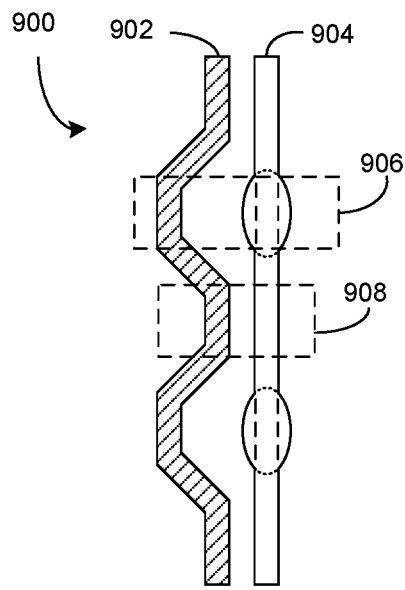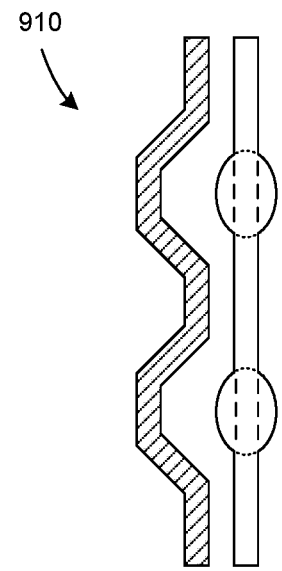
FIG. 9A  FIG. 9B
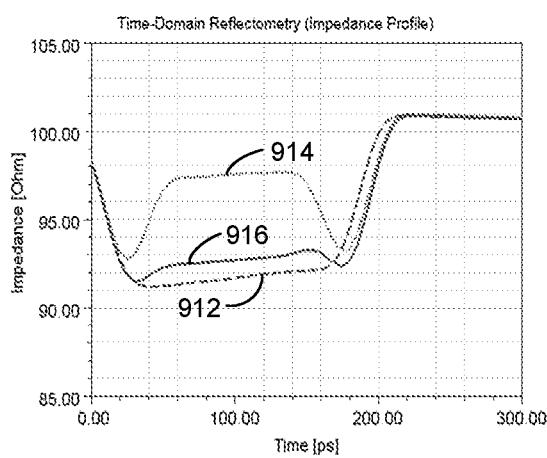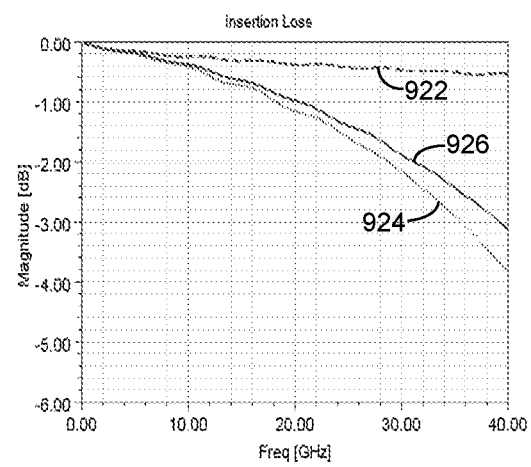
FIG. 9C  FIG. 9D

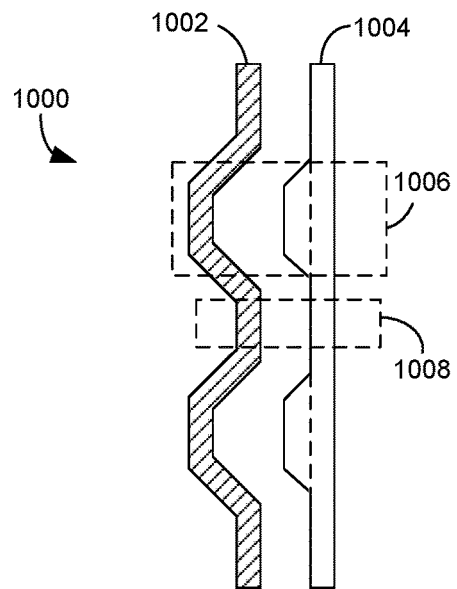
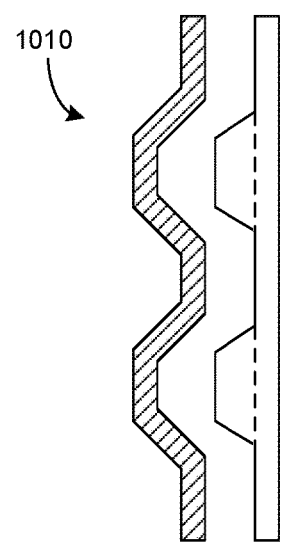
FIG. 10A
FIG. 10B
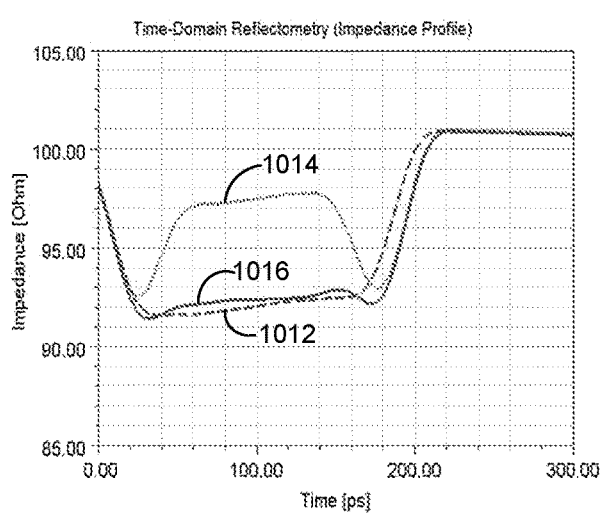
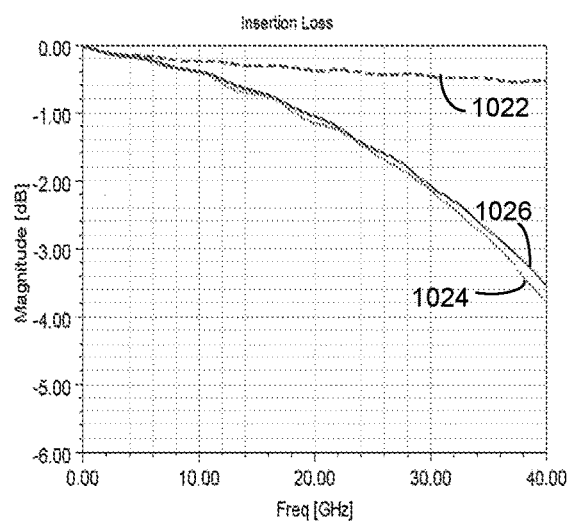
FIG. 10C
FIG. 10D

… (US 11,490,506 B2)

SKEW COMPENSATION APPARATUS FOR CONTROLLING TRANSMISSION LINE IMPEDANCE

RELATED APPLICATION

This application claims the benefit of U.S. Provisional Application No. 62/852,283, entitled "SKEW COMPENSATION DEVICE FOR CONTROLLING TRANSMISSION LINE IMPEDANCE," filed 23 May 2019, the disclosure of which is incorporated herein by reference in its entirety.

BACKGROUND

Field

This disclosure is generally related to differential transmission lines on printed circuit boards (PCBs). More specifically, this disclosure is related to a system and method that controls transmission line impedance while compensating for timing skews on differential transmission lines.

Related Art

A pair of differential transmission lines can include two conductive paths of equal length, with signals on the two paths being equal in amplitude but opposite in polarity. On a high-density PCB, due to spatial constraints, a pair of differential transmission lines can experience multiple bends and turns along its path, resulting in possible timing skews between the true or positive (denoted as "P") and complementary or negative (denoted as "N") signals. Conventional timing-skew compensation approaches can result in non-uniform impedance distribution along the pair of differential transmission lines.

BRIEF DESCRIPTION OF THE FIGURES

FIG. 9A illustrates a partial view of an exemplary pair of differential transmission lines, according to one embodiment.

FIG. 9B illustrates a partial view of an exemplary pair of differential transmission lines, according to one embodiment.

FIG. 9C illustrates the time-domain reflectometry (TDR) measurement of the impedance of a number of pairs of differential transmission lines, according to one embodiment.

FIG. 9D illustrates the simulated insertion loss for a number of pairs of differential transmission lines, according to embodiments of the present invention.

FIGS. 10A and 10B illustrate partial views of exemplary pairs of differential transmission lines, according to one embodiment.

FIGS. 10C and 10D illustrate the TDR measurement of the impedance and the frequency response of the insertion loss, respectively, of a number of pairs of differential transmission lines, according to one embodiment.

In the figures, like reference numerals refer to the same figure elements.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the scope of the present disclosure is not limited to the embodiments shown, but is to be accorded the widest scope consistent with the principles and features disclosed herein.

The embodiments described herein provide a solution for controlling the impedance of differential transmission lines while achieving timing-skew compensation. More specifically, the system can compensate for the timing skew of a pair of differential transmission lines by introducing, on the shorter trace, timing-skew compensation structures that can create additional delays in order to match the length of the longer trace. Creating a timing-skew compensation structure on a straight trace can include bending the trace to one direction and then back, forming a shape that looks like a top hat. Such timing-skew compensation structures are often referred to as top-hat structures. To enhance the uniformity of the impedance along the pair of differential transmission lines, the shape of the top-hat structures can be adjusted based on the impedance non-uniformity. In some embodiments, the trace widths of the top-hat structures can be modulated (e.g., by introducing desired offsets at particular segments). The location to apply the offsets and the amount of offsets can be designed such that the effect of timing-skew compensation can remain unchanged while the impedance uniformity of the pair of differential transmission lines can be improved. The shape of the trace not bearing the top-hat structures can also be adjusted (e.g., by modulating the width of the trace) to achieve similar effects.

Compared with single-ended signaling, differential signaling can provide a number of benefits, such as no return ground current, less EMI, reduced crosstalk, lower voltage, etc. Differential signaling uses a pair of differential transmission lines to carry electrical signals. However, timing skews between the two transmission lines of a pair of differential transmission lines can be problematic, especially for high-frequency applications. The intra-pair skew can cause unwanted resonances and additional channel loss, which are caused by the rejection of the incurred common-mode signal.

Figure 1:
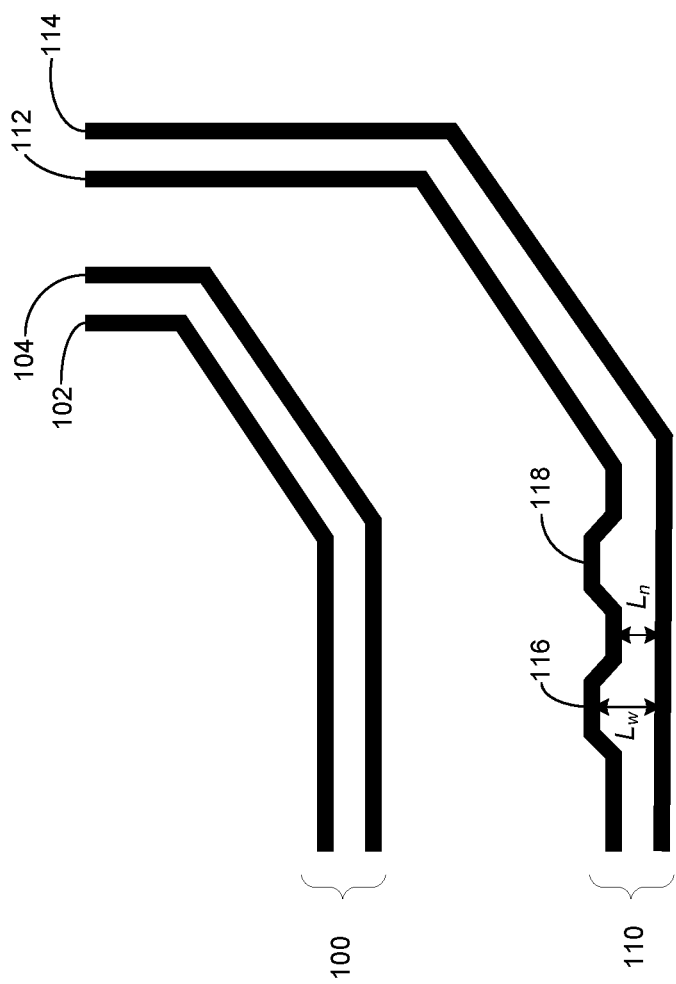
FIG. 1 illustrates an exemplary top-hat skew-compensation scheme, according to prior art.

Timing skew is the deviation of propagation delay from required reference timing. For a pair of differential transmission lines, the main source of skew is the length difference. Conductive traces on a complex PCB often need to bend or turn several times, thus resulting in a length difference between the two transmission lines of a pair. "Top-hat" structures have been used by many circuit designers as a simple mechanism for matching routing lengths. FIG. 1 shows an exemplary top-hat skew-compensation scheme, according to prior art. In FIG. 1, the partial view of two pairs of differential transmission lines is shown, pair of differential transmission lines 100 and pair of differential transmission lines 110. Each pair includes two parallel transmission lines with a number of turns. More specifically, pair 100 includes transmission lines 102 and 104, and pair 110 includes transmission lines 112 and 114. As one can see from FIG. 1, due to the bends or turns of each pair of differential transmission lines, the outer transmission line can be slightly longer than the inner transmission line. For example, transmission line 104 can be slightly longer than transmission line 102. Such a length difference can cause a timing skew (e.g., phase or group delay) between signals on transmission lines 102 and 104, which in turn can result in signal distortion in the time-domain response. To match the routing lengths in such a situation, top-hat structures (e.g., structures 116 and 118) can be added to the shorter transmission line. A top-hat structure is a mechanism to extend the length of a straight segment of the transmission line by introducing bends (which can be shaped like a top hat) or half circles/loops along the straight segment. In the example shown in FIG. 1, inner transmission line 112 of pair 110 can include top-hat structures 116 and 118, which can add to its total length such that the length of inner transmission line 112 matches the length of outer transmission line 114.

However, using top-hat structures to compensate for timing-skew can have unwanted effects, especially in a complex PCB where trace density is high. In a high-density PCB, long traces often have multiple (e.g., ten or more) bends, hence a large number of top-hat structures may be needed to compensate for the length difference resulting from the bends. For example, a certain high-density PCB design may require the trace carrying the true signal in a pair of differential transmission lines to include 10 consecutive top-hat structures. The large number of consecutive top-hat structures can lead to non-uniform impedance distribution along the transmission lines. More specifically, the existence of the top-hat structures can cause the spacing between the two transmission lines in the pair to alternate between a normal spacing (e.g., L, shown in FIG. 1) and a wider spacing (e.g., $L_w$ shown in FIG. 1). Time-domain reflectometry (TDR) measurements have revealed that consecutive top-hat structures can create an unwanted impedance peak. In certain situations, the impedance of the segment with consecutive top-hat structures can be 5 to 6 ohms above the normal impedance value (i.e., the impedance for two parallel traces).

Conventional approaches to mitigating the impedance variation caused by consecutive top-hat structures can include spreading the top-hat structures along the length of the pair of differential transmission lines and limiting the maximum number of top-hat structures to two or three locally, or decreasing the height of each top-hat structure (which can decrease the difference in spacing but will require more top-hat structures to compensate for the timing skew). However, these approaches do not apply to PCBs that require high-density signal routing with minimal spacing, because redistribution of these top-hat structures can be limited by space availability. In addition, limiting the number of top-hat structures may cause insufficient timing-skew compensation.

To improve the impedance uniformity of a pair of differential transmission lines that implements top-hat structures or any other type of skew-compensation structures (e.g., half circles) without negatively affecting the skew-compensation effect, in some embodiments, the shape of the skew-compensation structures (e.g., top-hats or half-circles) can be modified. More specifically, at locations where the spacing between the pair of traces is wider (which correspond to the "top" of the top-hat structures), one can increase the width of the metal trace(s), thus reducing the local impedance.

Figure 2A:
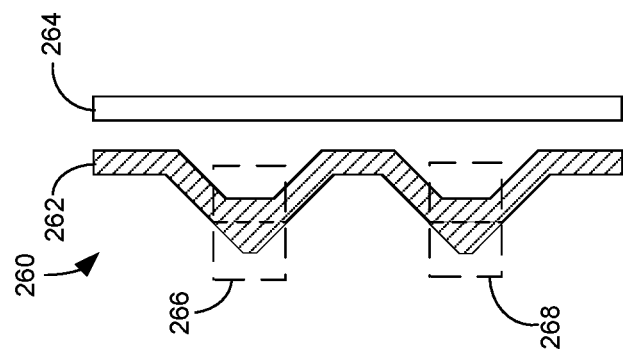
FIGS. 2A-2D illustrate partial views of a number of exemplary pairs of differential transmission lines, according to one embodiment.

FIG. 2A illustrates the partial view of an exemplary pair of differential transmission lines. In FIG. 2A, pair 200 includes a metallic trace 202 carrying the true signal and a metallic trace 204 carrying the complementary signal. In this example, metallic trace 202 can include a number of top-hat structures, such as top-hat structures 206 and 208. One can see from FIG. 2A that the existence of the top-hat structures causes the spacing between metallic traces 202 and 204 to alternate between a normal value and a wider value. More specifically, at the "top" of each top-hat structure, the spacing between the traces can be much larger compared with the normal trace spacing, i.e., the distance between the traces where no top-hat structure exists. As discussed previously, the variation in the trace spacing can cause local variation of the impedance. More specifically, the impedance of segments with normal spacing (e.g., segment 210) can have a lower value, and impedance of segments with larger spacing (e.g., segment 212) can have a higher value. To reduce the impedance variation in pair 200, one may wish to decrease the impedance of the segments with higher impedance values. One approach is to increase the width of metallic trace 202 within the high-impedance segments by moving the outer edge of metallic trace 202 within the high-impedance segments further away from metallic trace 204, as shown by the left-pointing arrows in FIG. 2A.

Figure 2B:
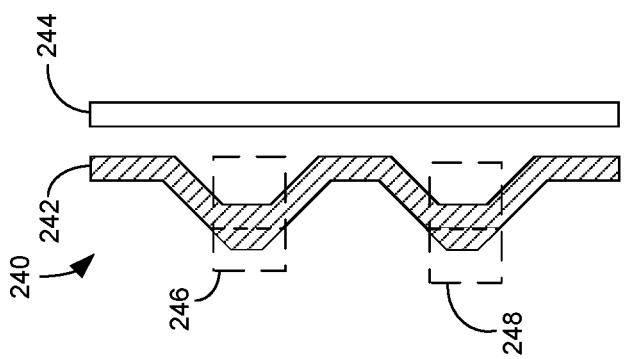

FIG. 2B illustrates a partial view of an exemplary pair of differential transmission lines, according to one embodiment. In FIG. 2B, pair of differential transmission lines 220 can include a metallic trace 222 carrying the true signal and a metallic trace 224 carrying the complementary signal. Unlike a conventional transmission line with a uniform width, the width of trace 222 can be non-uniform. More specifically, the width of metallic trace 222 at the wider-spaced segments (e.g., segment 226) can be larger than the width of metallic trace 222 at the normal-spaced segments (e.g., segment 228). More specifically, FIG. 2B shows that the larger width can be obtained by moving the outer edge of metallic trace 222 within the wider-spaced segments further outward. In other words, the outer edges of the "top" of the top-hat structures are moved further away from adjacent metallic trace 224. The vertical dashed lines within metallic trace 222 indicate the original locations of the outer edge of metallic trace 222 if metallic trace 222 were a conventional trace with uniform width.

Figure 2C:
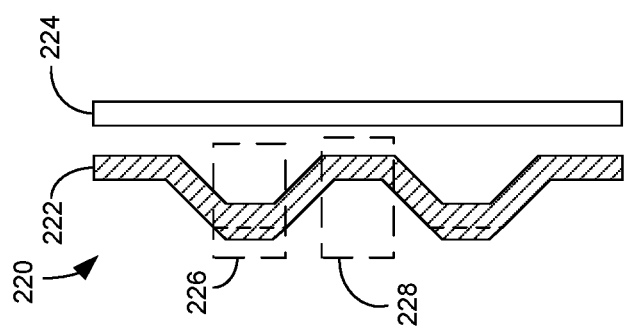
Figure 2D:
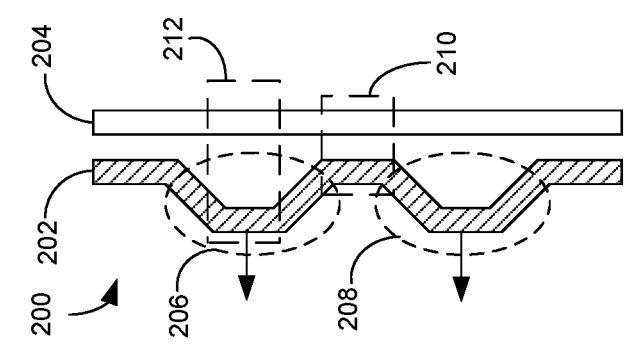

The designs shown in FIG. 2C and FIG. 2D can be similar to the design shown in FIG. 2B, except that the outer edges of the wider-spaced segments can be moved further outward, causing the corresponding metal sections to have a larger width. In the example shown in FIG. 2C, pair of differential transmission lines 240 can include a metallic trace 242 carrying the true signal and a metallic trace 244 carrying the complementary signal. A number of segments (e.g., segments 246 and 248) of metallic trace 242 can be wider than the rest of metallic trace 242 or than metallic trace 244. Moreover, the width of segments 246 and 248 can be greater than the similar segments (e.g., segments 226 and 228) shown in FIG. 2B. Note that the vertical dashed lines in metallic trace 242 can indicate the original locations of the outer edge of those segments before they are widened.

Similarly, FIG. 2D shows a pair of differential transmission lines 260 that includes a metallic trace 262 carrying the true signal and a metallic trace 264 carrying the complementary signal. The width of the wider-spaced segments (e.g., segments 266 and 268) of metallic trace 262 is much larger than that of other portions of metallic trace 262 or that of metallic trace 264. In FIG. 2D, the outer edges of these wider-spaced segments are moved further out (compared with the vertical dashed lines indicating their original location), such that the width of segments 266 and 268 is greater than the similar segments (e.g., segments 246 and 248) in FIG. 2C.

Figure 3:
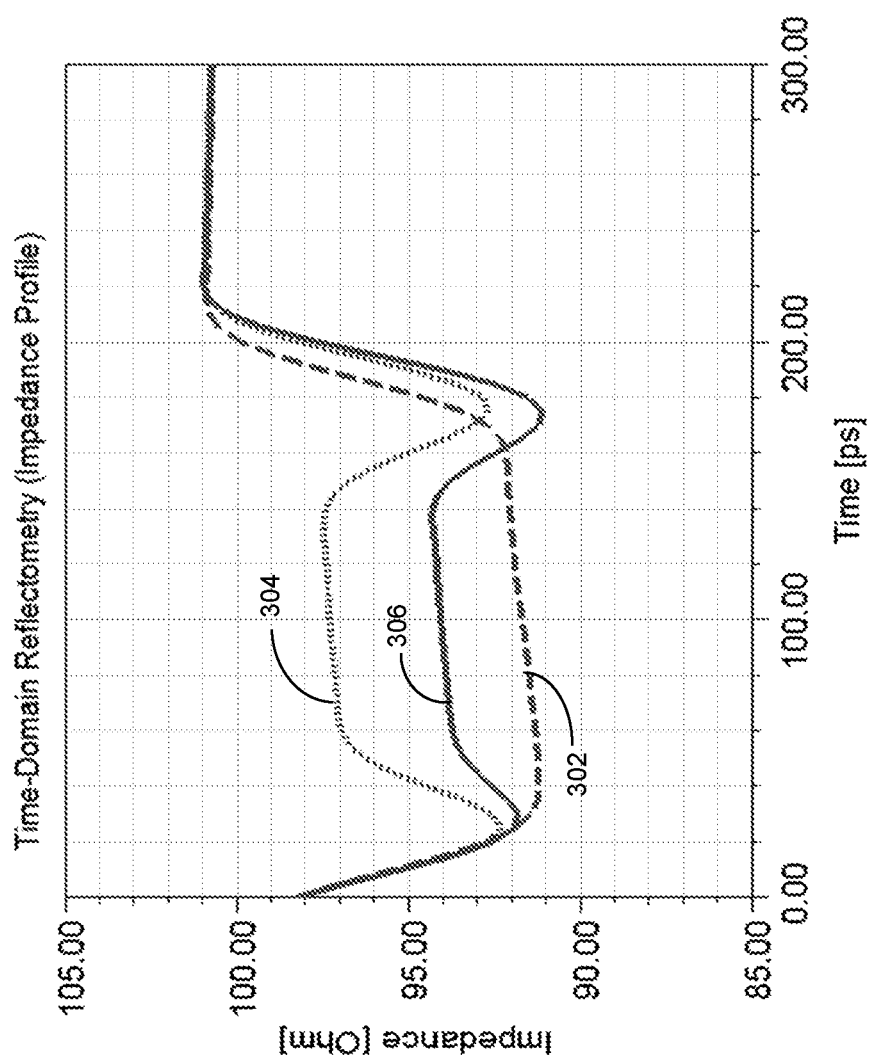
FIG. 3 illustrates the time-domain reflectometry (TDR) measurement of the impedance of a number of pairs of differential transmission lines, according to one embodiment.

FIG. 3 illustrates the time-domain reflectometry (TDR) measurement of the impedance of a number of pairs of differential transmission lines, according to one embodiment. More specifically, measurement curve 302 in FIG. 3 corresponds to the impedance profile of a pair of differential transmission lines with no timing skew and no top-hat structures. This is the ideal situation where the impedance remains uniform in areas of interest (e.g., between 40 and 160 ps). When consecutive top-hat structures are introduced, the impedance goes up, as indicated by measurement curve 304, which corresponds to the impedance profile of a pair of differential transmission lines with normal (i.e., uniform-width) top-hat structures, such as the top-hat structures shown in FIG. 2A. More specifically, curve 304 in FIG. 3 can correspond to a pair of differential transmission lines that includes ten or more normal top-hat structures. From FIG. 3, one can see that when normal top-hat structures are used for skew compensation, the local impedance may increase by several (e.g., between five and six) ohms. When the trace width of the "top" portion of the top-hat structures increases (e.g., as shown in FIGS. 2B-2D), the local impedance decreases, compared with the situation where normal top-hat structures are used, as indicated by measurement curve 306 shown in FIG. 3. In this example, curve 306 corresponds to the measured impedance corresponding to pair 260 shown in FIG. 2D; the impedance difference between curve 306 and ideal curve 302 can be reduced to approximately two ohms. The impedance curves of pairs 220 and 240, although not shown in FIG. 3, can lie between curves 304 and 306.

In addition to modifying the shape of a top-hat structure by extending its outer edge (e.g., the outer surface of the "top" of the top-hat structure), one can also modify the shape of a top-hat structure by moving the inner edge of the "top" of the top hat closer to the other trace, which also achieves the goal of increasing the width of the metal trace at the wider-spaced segment, and therefore reducing impedance at such a segment. Moreover, this change can also reduce the effective spacing between the two metallic traces in the pair of differential transmission lines, thus further reducing the impedance of the pair.

Figure 4A:
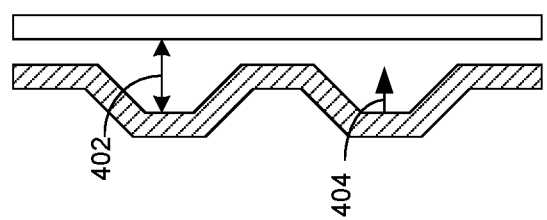
FIGS. 4A-4D illustrate partial views of a number of exemplary pairs of differential transmission lines, according to one embodiment.
Figure 4B:
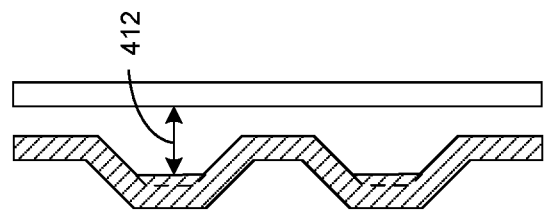
Figure 4C:
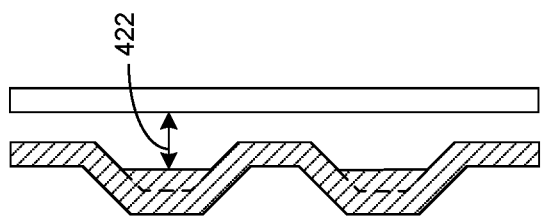
Figure 4D:
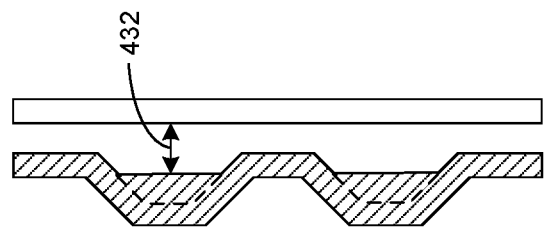

FIGS. 4A-4D illustrate the partial view of a number of exemplary pairs of differential transmission lines. More specifically, FIG. 4A shows a conventional pair of differential transmission lines with normal top-hat structures. In FIG. 4A, double arrow 402 indicates the wider spacing between the "top" of a top-hat structure of the metallic trace carrying the true signal and the adjacent metallic trace carrying the complementary signal. Arrow 404 indicates the direction in which one can extend the inner edge of the "top" of the top-hat structure. FIGS. 4B-4D illustrate exemplary pairs of differential transmission lines with modified top-hat structures, according to embodiments of the present invention. In the examples shown in FIGS. 4B-4D, each top-hat structure can be achieved by modifying the shape of a conventional uniform-width top-hat structure. More specifically, such modification can be achieved by extending the inner edge of the "top" of each top-hat structure closer to the adjacent trace, which not only increases the metal width of the "top" portion of the top hat, but also decreases the effective trace spacing, as indicated by double arrows 412, 422, and 432 shown in FIGS. 4B, 4C, and 4D, respectively. Among the examples shown in FIGS. 4B-4D, the effective inter-trace spacing is the smallest in FIG. 4D.

Figure 5:
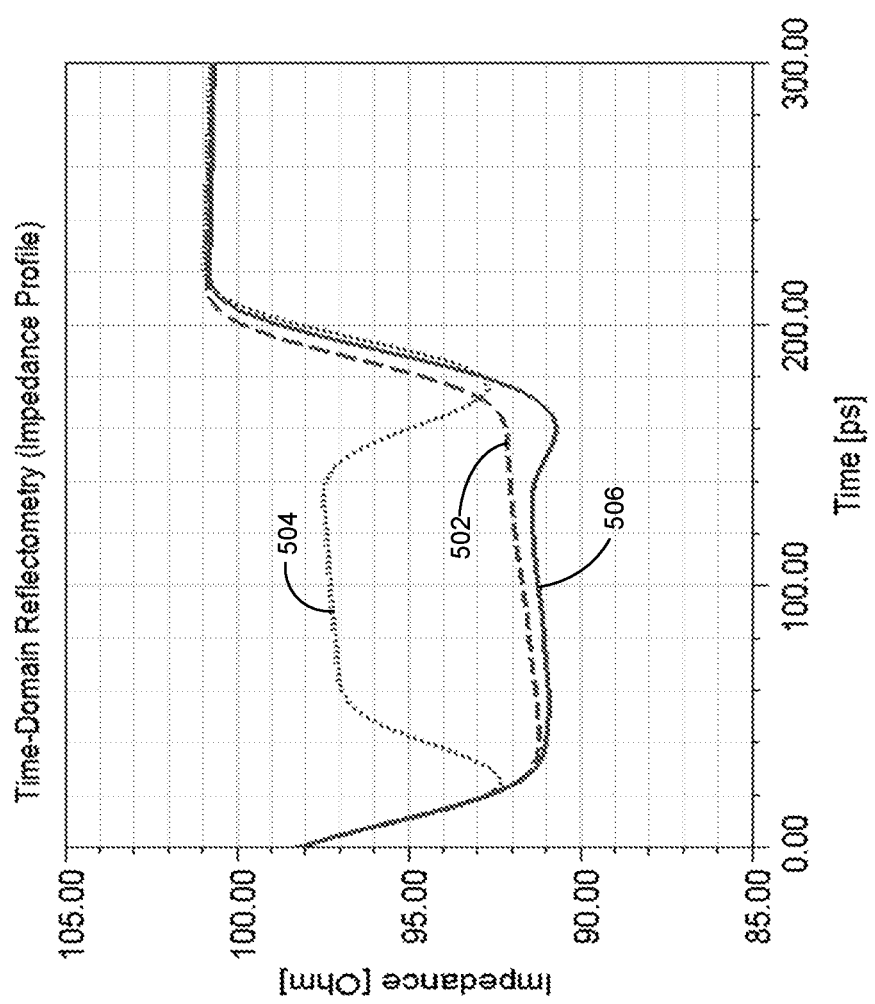
FIG. 5 illustrates the time-domain reflectometry (TDR) measurement of the impedance of a number of pairs of differential transmission lines, according to one embodiment.

FIG. 5 illustrates the time-domain reflectometry (TDR) measurement of the impedance of a number of pairs of differential transmission lines, according to one embodiment. Measurement curves 502 and 504 in FIG. 5 can be similar to curves 302 and 304 in FIG. 3, respectively, with curve 502 corresponding to the impedance profile of a pair of differential transmission lines with no skew and no top-hat structures, and curve 504 corresponding to the impedance profile of a pair with normal (i.e., uniform-width) top-hat structures. FIG. 5 also shows a measurement curve 506 that corresponds to a pair of differential transmission lines with modified top-hat-structures, such as the ones shown in FIGS. 4B-4D. In this particular example, curve 506 can correspond to the pair shown in FIG. 4D, which has the smallest effective inter-trace spacing among the pairs shown in FIGS. 4B-4D. One can see from FIG. 5 that the impedance of the pair shown in FIG. 4D can be very similar to the ideal situation. More specifically, the difference between curves 502 and 506 can be less than one ohm.

FIG. 3 and FIG. 5 can demonstrate that increasing the width of the "top" portion of the top-hat structures (e.g., by moving either the outer edge further away from or the inner edge closer to the adjacent trace) can decrease the local impedance, thus improving impedance uniformity along the pair of differential transmission lines. The approaches shown in FIGS. 2A-2D and FIGS. 4A-4D, however, may also have certain limitations. The approach shown in FIGS. 2A-2D may have limited capability to compensate for the impedance non-uniformity in certain cases. The approach shown in FIGS. 4A-4D may be limited by the spacing between the two parallel traces. Moreover, these two approaches may also cause the degradation of the skew-compensation effect of the top-hat structures.

Figure 6A:
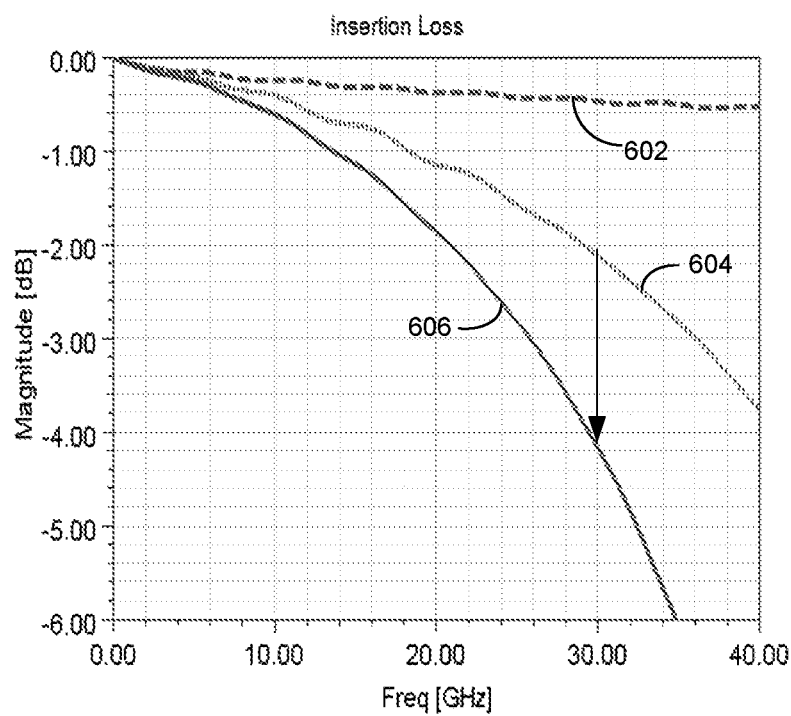
FIGS. 6A-6B illustrate the simulated insertion loss for a number of pairs of differential transmission lines, according to embodiments of the present invention.
Figure 6B:
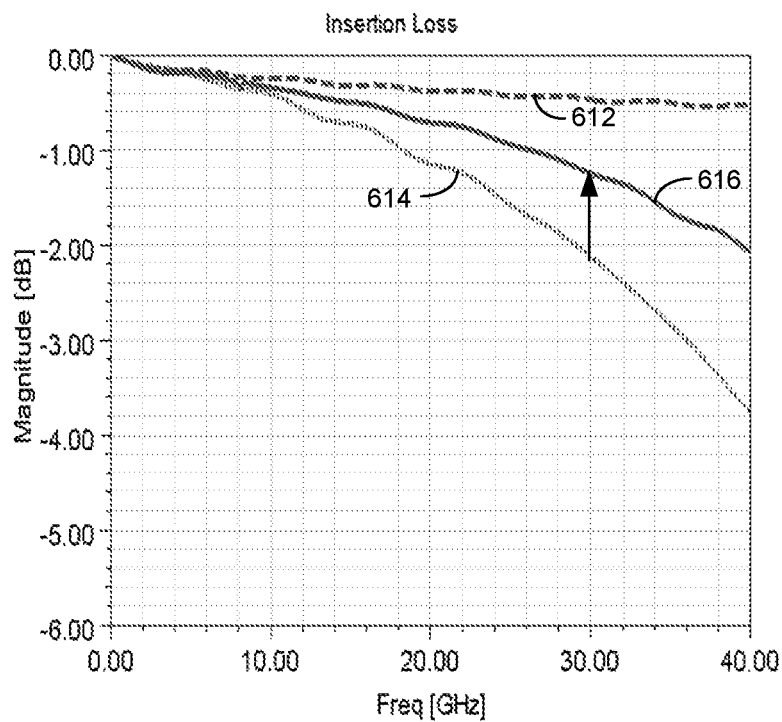

FIGS. 6A and 6B illustrate the simulated insertion loss for a number of pairs of differential transmission lines, according to embodiments of the present invention. More specifically, FIG. 6A compares the frequency response of the insertion loss of a pair of differential transmission lines with no skew and no top-hat structures (curve 602), a pair with normal uniform-width top-hat structures (curve 604), and a pair with top-hat structures modified using the approach shown in FIG. 2D (curve 606). Note that the frequency response of the insertion loss can be an indication of the timing skew. A flat frequency response indicates little or no timing skew, as shown by curve 602, whereas insertion loss roll-offs (as shown by curves 604 and 606) indicates the timing skew caused by the top-hat structures. As can be seen in FIG. 6A, when the top-hat structures are modified using the approach shown in FIGS. 2B-2D (e.g., when the outer edge of the "tops" of the top-hat structures are moved away from the adjacent trace), the amount of timing skew introduced by these modified top-hat structures can be more than that of the normal top-hat structures, as indicated by the arrow pointed downward. In other words, this top-hat modification approach may cause overcompensation for the timing skew. To avoid the overcompensation, one can reduce the number of top-hat structures.

FIG. 6B also compares the frequency response of the insertion loss of a pair of differential transmission lines with no skew and no top-hat structures (curve 612), a pair with normal uniform-width top-hat structures (curve 614), and a pair with top-hat structures modified using the approach shown in FIG. 4D (curve 616). As can be seen in FIG. 6B, when the top-hat structures are modified using the approach shown in FIGS. 4B-4D (e.g., when the inner edge of the "tops" of the top-hat structures are moved closer to the adjacent trace), the amount of timing skew introduced by these modified top-hat structures can be less than that of the normal top-hat structures, as indicated by the arrow pointing upward. In other words, this top-hat modification approach may cause the timing skew to be under compensated. To avoid undercompensation, one can increase the number of top-hat structures.

Comparing the effects on the timing skew of the two top-hat modification approaches, one may notice that one approach (e.g., the one shown in FIGS. 2A-2D) enhances the timing-skew compensation effect of the top-hat-structures, whereas the other approach (e.g., the one shown in FIGS. 4A-4D) reduces the timing-skew compensation effect of the top-hat structures. To mitigate the impedance non-uniformity of the top-hat structures without affecting the amount of timing skew provided by those top-hat structures, in some embodiments, the modification of the top-hat structures can combine both approaches by simultaneously moving the outer and inner edges of the "top" portion of the top-hat structure away from each other, which not only increases the width of the corresponding metal segments but also decreases the effective inter-trace spacing.

Figure 7D:
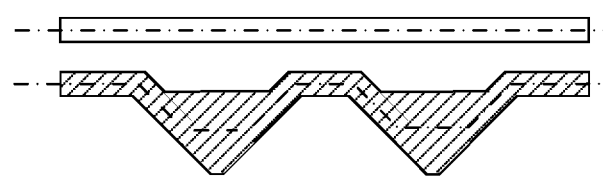
FIGS. 7A-7D illustrate exemplary pairs of differential transmission lines with modified top-hat structures, according to embodiments of the present invention.
Figure 7C:
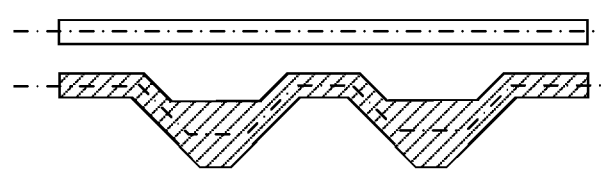
Figure 7B:
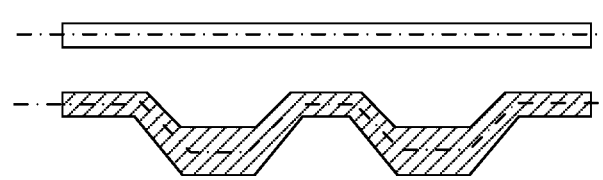
Figure 7A:
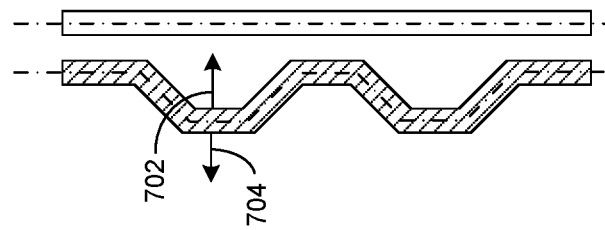

FIG. 7A illustrates a partial view of an exemplary pair of differential transmission lines with normal top-hat structures, according to prior art. In FIG. 7A, arrows 702 and 704 can indicate the directions that one can extend the outer and inner edges of the "top" portion of the top hat structure. FIGS. 7B-7D illustrate exemplary pairs of differential transmission lines with modified top-hat structures, according to embodiments of the present invention. In the examples shown in FIGS. 4B-4D, each top-hat structure can be achieved by modifying the shape of a conventional uniform-width top-hat structure. More specifically, such modification can be achieved by extending the outer edge of the "top" section of each top-hat structure further out, away from the adjacent trace, and the inner edge of the "top" section inwardly, closer to the adjacent trace. Compared with the pairs shown in FIGS. 2B-2D and 4B-4D, the width of the metal segments corresponding to the "top" of the top-hat structures can be increased more, with the same amount of offset applied to either edge. If the offset applied to the outer edge of each "top" section can be marked as $\delta x$ and the offset applied to the inner edge of each "top" section can be marked as $\delta y$, then the total increment to the width of the "top" sections of the top-hat structures in FIGS. 7B-7D can be $\delta x+\delta y$, whereas the increment to the width of the "top" sections in FIG. 2B-2D or 4B-4D will only be $\delta x$ or $\delta y$, respectively. The increments to the width of the "top" section of the top-hat structures in the pairs of differential transmission lines shown in FIGS. 7B, 7C, and 7D can be $\delta x_1+\delta y_1$, $\delta x_2+\delta y_2$, and $\delta x_3+\delta y_3$, respectively.

In some embodiments, the offset value applied to the outer and inner edges can be similar (e.g., $\delta x=\delta y$), so that the location of the center line of the trace can remain substantially unchanged after modifications are made to the top-hat structures. In FIGS. 7A-7D, dashed lines mark the position of the centers of the transmission lines, including the one with the top-hat structures and the one without. As can be seen in FIGS. 7A-7D, the locations of the center lines of the transmission lines remain the same, even though the top-hat structures in each pair of differential transmission lines have different shapes. The unchanged center lines indicate that these pairs can have similar amounts of timing skew. When the center of the true-signal trace deviates from its original location due to the extension of its edges in one direction (as shown in FIGS. 2B-2D and FIGS. 4B-4D), the effective trace length may change, causing the timing-skew compensation to deviate from that resulting from the normal top-hat structures (as evidenced by the results shown in FIGS. 6A-6B). When the outer edge of "top" portion of a top-hat structure is extended, the effective height of the top-hat structure increases, causing more timing skew. When the inner edge of "top" moves closer to the other trace, the effective height of the top-structures decreases, causing less timing skew. In other words, the amount of timing skew that is needed can somewhat determine the height (and thus the center line of the "top" portion) of the top-hat structures. On the other hand, the width of the "top" portion of the top-hat structures can be determined based on the need to compensate for the impedance non-uniformity caused by the hot-hat structures. Note that these two factors (e.g., the timing skew and impedance non-uniformity) are not completely decoupled. For example, the width of the "top" may also slightly affect the timing skew, and the centerline location may also affect the impedance uniformity.

Figure 8A:
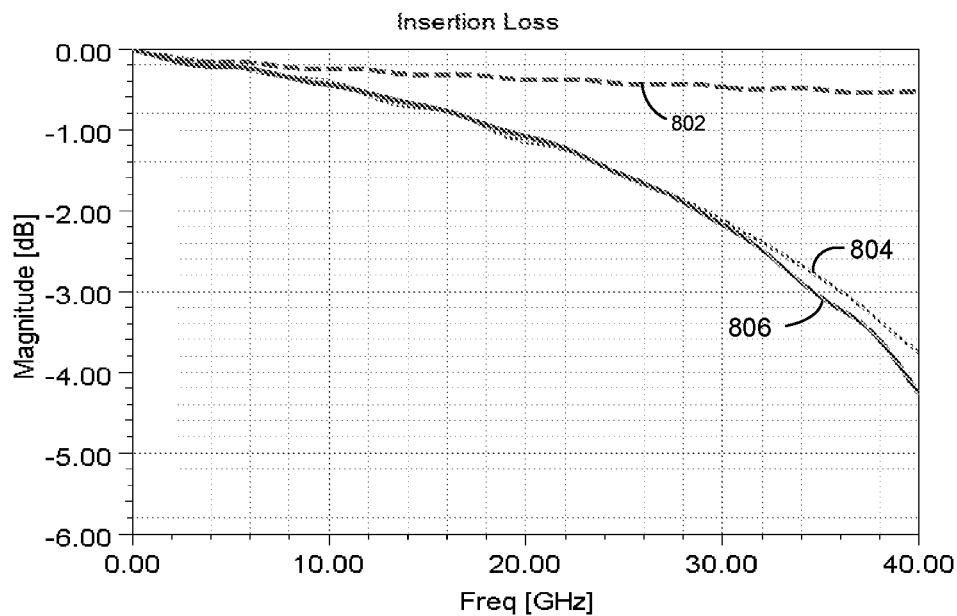
FIG. 8A illustrates the simulated insertion loss for a number of pairs of differential transmission lines, according to embodiments of the present invention.

FIG. 8A illustrates the simulated insertion loss for a number of pairs of differential transmission lines, according to embodiments of the present invention. More specifically, FIG. 8A compares the frequency response of the insertion loss of a pair of differential transmission lines with no skew and no top-hat structures (curve 802), a pair with normal uniform-width top-hat structures (curve 804), and a pair with top-hat structures modified using the approach shown in FIG. 7D (curve 806). One can see from FIG. 8A that the amount of timing skew introduced by the modified top-hat structures can be very similar to the amount of timing skew introduced by the normal top-hat structures, meaning that they can have similar timing-skew compensation abilities.

Figure 8B:
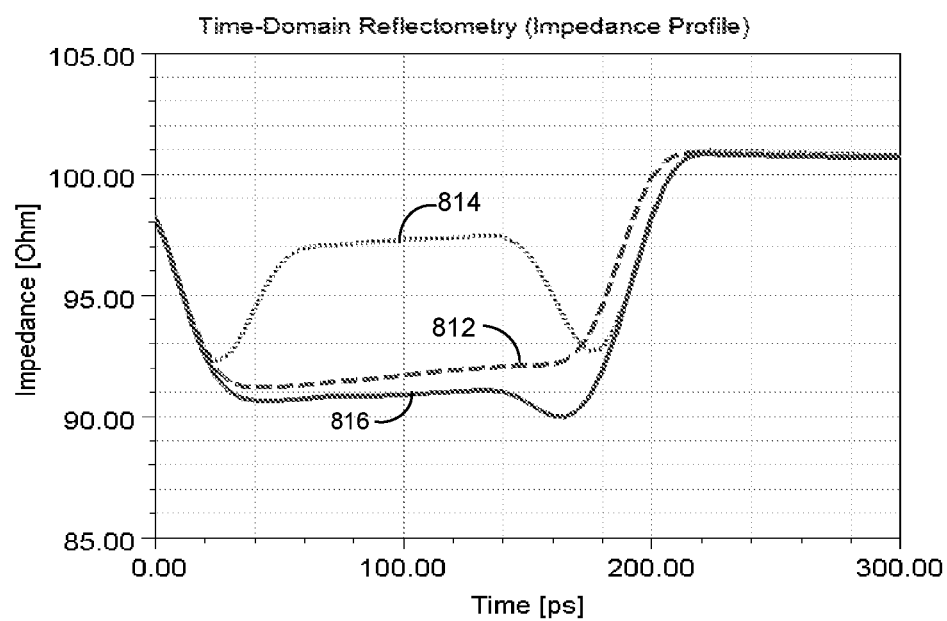
FIG. 8B illustrates the time-domain reflectometry (TDR) measurement of the impedance of a number of pairs of differential transmission lines, according to one embodiment.

FIG. 8B illustrates the time-domain reflectometry (TDR) measurement of the impedance of a number of pairs of differential transmission lines, according to one embodiment. More specifically, curves 812 and 814 in FIG. 8B can be similar to curves 302 and 304 in FIG. 3, respectively, with curve 812 corresponding to the impedance profile of a pair of differential transmission lines with no skew and no top-hat structures, and curve 814 corresponding to the impedance profile of a pair with normal (i.e., uniform-width) top-hat structures. FIG. 8B also shows a curve 816 that corresponds to a pair of differential transmission lines with modified top-hat-structures, such as the one shown in FIG. 7D. One can see from FIG. 8B that the impedance of the pair shown in FIG. 7D can be very similar to the ideal situation where no top-hat structure is used. More specifically, the difference between curves 812 and 816 can be less than one ohm.

The measurement results shown in FIGS. 8A and 8B can indicate that, by modifying the shape of the "top" sections of the top-hat structures, one can achieve the desired timing-skew compensation effect without causing unwanted impedance non-uniformity. One key factor to achieving such a goal is to increase the width of the metal segments where the two transmission traces have a wider spacing. In the examples shown in FIGS. 2B-2D, 4B-4D, and 7B-7D, modifications are made to the "top" portion of the top-hat structures. One can also keep the metallic trace carrying the true signal and having the top-hat structures unchanged but modify the other metallic trace carrying the complementary signal. The width of the complementary-signal trace can be modulated to reduce the impedance non-uniformity resulting from the top-hat structures.

FIG. 9A illustrates a partial view of an exemplary pair of differential transmission lines, according to one embodiment. In FIG. 9A, pair of differential transmission lines 900 can include a metallic trace 902 carrying the true signal and a metallic trace 904 carrying the complementary signal. True-signal trace 902 can include a number of top-hat structures and can have a uniform width throughout its length, including the top-hat sections and the regular straight sections. The width of complementary-signal trace 904 is no longer uniform. Segments that have a wider inter-trace spacing (e.g., segment 906) can have a larger width than nominal-spaced segments (e.g., segment 908). More specifically, FIG. 9A shows that a segment having a larger width (e.g., segment 906) can have non-straight convex edges, resulting in the increased effective width of such a segment. In the example shown in FIG. 9A, the enlarged segments can be achieved by overlapping an elliptically-shaped segment on the original straight, uniform-width segments, as indicated by the dashed ellipses. The vertical dashed lines within metallic trace 904 indicate the original locations of the straight edges of a conventional trace with a uniform width.

FIG. 9B illustrates a partial view of an exemplary pair of differential transmission lines, according to one embodiment. Pair of differential transmission lines 910 shown in FIG. 9B can be similar to pair 900 shown in FIG. 9A, except that the elliptically-shaped segment overlapping the complementary-signal trace can have a different aspect ratio. Note that the major axis (i.e., the vertical axis shown in FIGS. 9A and 9B) of the ellipses in pairs 900 and 910 can be similar, but the minor axis (i.e., the horizontal axis) of these ellipses can be different. More specifically, the major axis can be substantially similar to the length of each top-hat structure, and the minor axis of the ellipses in pair 900 can be smaller than that of the ellipses in pair 910. This results in the enlarged portions of pair 910 being wider those of pair 900.

FIG. 9C illustrates the time-domain reflectometry (TDR) measurement of the impedance of a number of pairs of differential transmission lines, according to one embodiment. More specifically, measurement curves 912 and 914 in FIG. 9C can be similar to curves 302 and 304 in FIG. 3, respectively, with curve 912 corresponding to the impedance profile of a pair of differential transmission lines with no skew and no top-hat structures and curve 914 corresponding to the impedance profile of a pair with normal top-hat structures and a straight (i.e., uniform-width) complementary-signal trace. FIG. 9C also shows a curve 916 that corresponds to a pair of differential transmission lines with a modified (e.g., varying width) complementary-signal trace, such as the ones shown in FIG. 9B. One can see from FIG. 9C that the impedance of the pair shown in FIG. 9B can be very similar to the ideal situation where no top-hat structure is used. More specifically, the difference between curves 912 and 916 can be about one ohm.

FIG. 9D illustrates the simulated insertion loss for a number of pairs of differential transmission lines, according to embodiments of the present invention. More specifically, FIG. 9D compares the frequency response of the insertion loss of a pair of differential transmission lines with no skew and no top-hat structures (curve 922), a pair with normal uniform-width top-hat structures and a straight (i.e., uniform-width) complementary-signal trace (curve 924), and a pair with normal top-hat structures and a modified (e.g., varying width) complementary-signal trace, such as the one shown in FIG. 9B (curve 926). FIG. 9D shows that the amount of timing skew introduced by the normal top-hat structures can be reduced when the complementary-signal trace is modified to include enlarged portions at locations with a larger inter-trace spacing.

In addition to ellipses, the enlarged portions of the complementary-signal trace can also have other shapes, such as squares, rectangles, trapezoids, etc. FIGS. 10A and 10B illustrate partial views of exemplary pairs of differential transmission lines, according to one embodiment. In FIG. 10A, pair of differential transmission lines 1000 can include a metallic trace 1002 carrying the true signal and a metallic trace 1004 carrying the complementary signal. True-signal trace 1002 can include a number of top-hat structures and can have a uniform width throughout its length, including the top-hat sections and the regular straight sections. On the other hand, the width of complementary-signal trace 1004 is non-uniform. More specifically, segments that have a wider inter-trace spacing (e.g., segment 1006) can have a larger width than nominal-spaced segments (e.g., segment 1008). In FIG. 10A, a segment having the larger width (e.g., segment 1006) can have a portion extruding toward the adjacent trace, resulting in the increased effective width of such a segment. The extruded portion can be shaped like a trapezoid. The vertical dashed lines within metallic trace 1004 indicate the original locations of the straight edges of a conventional trace with a uniform width. FIG. 10B shows a pair of differential transmission lines 1010 that is similar to pair 1000 shown in FIG. 10A, except that the extruded trapezoids in pair 1010 have a larger height than the corresponding trapezoids in pair 1000. In other words, the effective width of the complementary-signal trace of pair 1010 at the wider-spaced locations is larger than that of pair 1000.

FIGS. 10C and 10D illustrate the TDR measurement of the impedance and the frequency response of the insertion loss, respectively, of a number of pairs of differential transmission lines, according to one embodiment. FIG. 10C can be similar to FIG. 9C and it compares the impedance profiles of a pair of differential transmission lines with no skew and no top-hat structures (curve 1012), a pair with normal top-hat structures and a straight (i.e., uniform-width) complementary-signal trace (curve 1014), and a pair with a modified (e.g., varying width) complementary-signal trace (curve 1016), such as the one shown in FIG. 10B. Comparing FIG. 10C to FIG. 9C, one can see that the pair of differential transmission lines with the trapezoid-shaped extrusions can have improved impedance uniformity over the pair with the ellipse-shaped extrusions.

FIG. 10D can be similar to FIG. 9D and it compares the frequency response of the insertion loss of a pair of differential transmission lines with no skew and no top-hat structures (curve 1022), a pair with normal uniform-width top-hat structures and a straight (i.e., uniform-width) complementary-signal trace (curve 1024), and a pair with normal top-hat structures and a modified (e.g., varying width) complementary-signal trace, such as the one shown in FIG. 10B (curve 1026). FIG. 10D shows that the amount of timing skew introduced by the normal top-hat structures can be slightly reduced when the complementary-signal trace is modified to include trapezoid-shaped extrusion at locations with a larger inter-trace spacing. Comparing FIG. 10D with FIG. 10C, one can also see that the deviation in the timing-skew effect of the pair of differential transmission lines with the trapezoid-shaped extrusions can be less than that of the pair with the ellipse-shaped extrusions.

Other mechanisms can also be used to mitigate the impedance non-uniformity. In the aforementioned examples, only one trace, the true-signal trace or the complementary-signal trace, in the pair of differential transmission lines is modified. It is also possible to modify both signal traces to ensure that the impedance uniformity can be improved without jeopardizing the timing-skew compensation provided by the top-hat structures.

Figure 11:
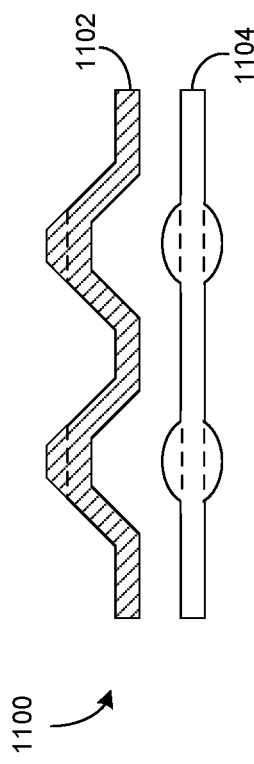
FIG. 11 illustrates a partial view of an exemplary pair of differential transmission lines, according to one embodiment.

FIG. 11 illustrates a partial view of an exemplary pair of differential transmission lines, according to one embodiment. In FIG. 11, pair of differential transmission lines 1100 can include a metallic trace 1102 carrying the true signal and a metallic trace 1104 carrying the complementary signal. True-signal trace 1102 can include a number of modified top-hat structures. In this example, the outer or top edge of the "top" portion of a top hat can be moved further out, away from the other trace, increasing the width of the "top" portion. On the other hand, complementary-signal trace 1104 can also have a varying width. In this example, complementary-signal trace 1104 includes a number of segments with non-straight convex edges at locations that are adjacent to the "top" of the top-hat structures. By carefully selecting the amount of offset applied to the "top" of the top-hat structures in true-signal trace 1102 and the aspect ratio of the elliptically-shaped segment overlapping complementary-signal trace 1104, one can achieve the desired timing-skew compensation while maintaining the impedance uniformity for pair of differential transmission lines 1100. Note that the modified top-hat structures in true-signal trace 1102 increase the timing skew, whereas modified complementary-signal trace 1104 decreases the timing skew. Hence, the combined effects will be a constant timing skew, similar to the timing skew created by normal top-hat structures.

Figure 12:
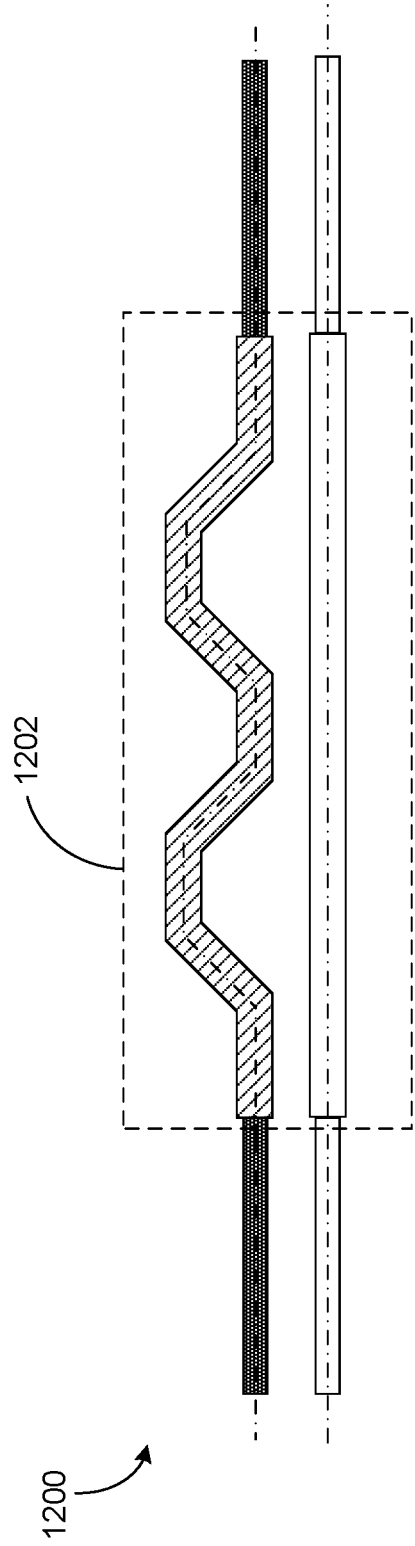
FIG. 12 illustrates a partial view of an exemplary pair of differential transmission lines, according to one embodiment.

Another approach to reduce the impedance non-uniformity is to reduce the impedance of the segment comprising the top-hat structures by symmetrically increasing the width of both the top-hat structures and the corresponding sections of the complementary-signal trace. FIG. 12 illustrates a partial view of an exemplary pair of differential transmission lines, according to one embodiment. In FIG. 12, pair of differential transmission lines 1200 can include a segment that includes multiple top-hat structures, such as segment 1202. In the example shown in FIG. 12, segment 1202 includes two consecutive top-hat structures. In practice, it is also possible for such a segment to have ten or more top-hat structures. To reduce the local impedance at segment 1202, in some embodiments, the width of the metal traces within segment 1202, including the top-hat structures and the adjacent straight trace, can be increased in a symmetric way, such that the centerline (as marked by the dashed lines) for each trace remains unchanged. By increasing the trace metal width, the impedance of the trace can be decreased; while the existence of the top-hat structures tends to increase the effective impedance. As a result, the local impedance of segment 1202 can be the same as the straight portions of pair 1200.

Figure 13:
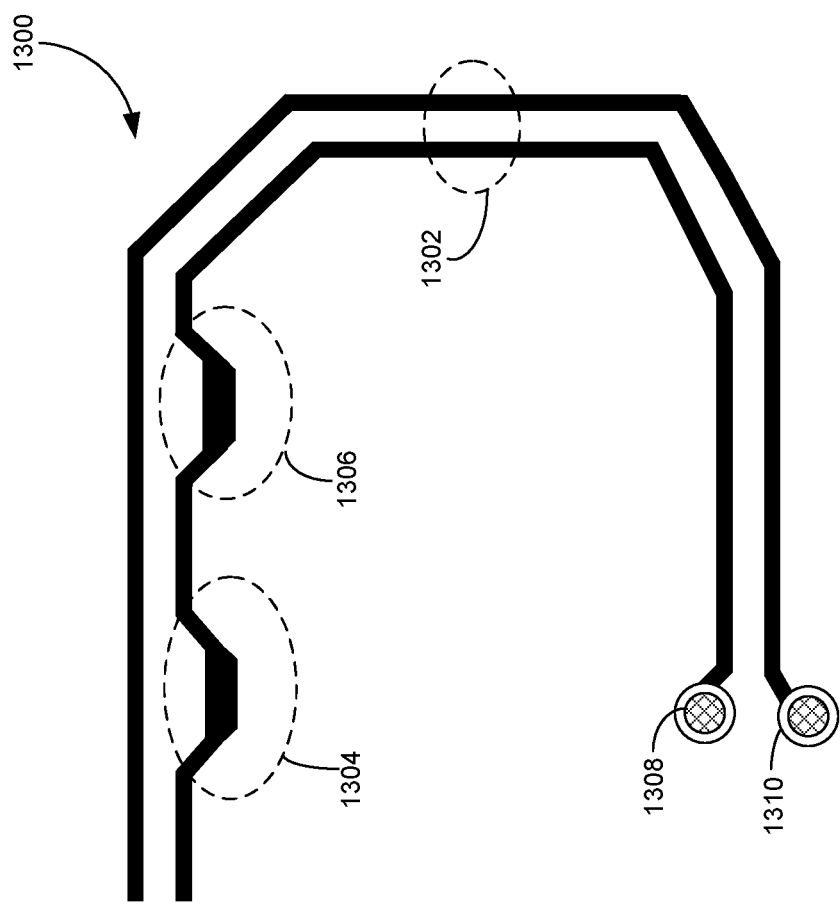
FIG. 13 illustrates an exemplary printed circuit board (PCB), according to one embodiment.

FIG. 13 illustrates an exemplary printed circuit board (PCB), according to one embodiment. In FIG. 13, PCB 1300 can include a pair of differential transmission lines 1302. PCB 1300 can be a multilayer PCB that comprises one or more dielectric layers and multiple metal layers, with adjacent metal layers being separated by a dielectric layer. Due to the required bends and turns, the inner transmission line, which can carry the true signal, can be shorter and a number of skew-compensation structures (e.g., top-hat structures 1304 and 1306) can be included in the inner transmission line. In the example shown in FIG. 13, top-hat structures 1304 and 1306 can be modified such that the "top" sections (i.e., the sections that are parallel to the other or outer transmission line) of each top can be widened, similar to what is shown in FIGS. 4B-4D. The resulting pair of differential transmission lines 1302 not only has its timing skew fully compensated for, but also maintains a uniform distribution of impedance through its length. FIG. 13 also shows that the transmission lines are coupled to signal vias 1308 and 1310, which allow the transmission lines to be connected to components or signal traces in other layers.

In FIG. 13, the top-hat modification scheme shown in FIGS. 4B-4D is used to enhance the impedance uniformity. In practice, various schemes can be used to change the shape of the transmission lines to achieve the desired skew-compensation effect while reducing unwanted impedance non-uniformity. The pair of differential transmission lines that include the skew-compensation structures (e.g., top-hat structures or other similar structures) can be located on any layer (such as the top layer or a middle layer) of a multilayer PCB. Moreover, the pair of differential transmission lines can be in the form of striplines or microstrips. The scope of this disclosure in not limited by the PCB structure or the type of transmission lines.

Figure 14:
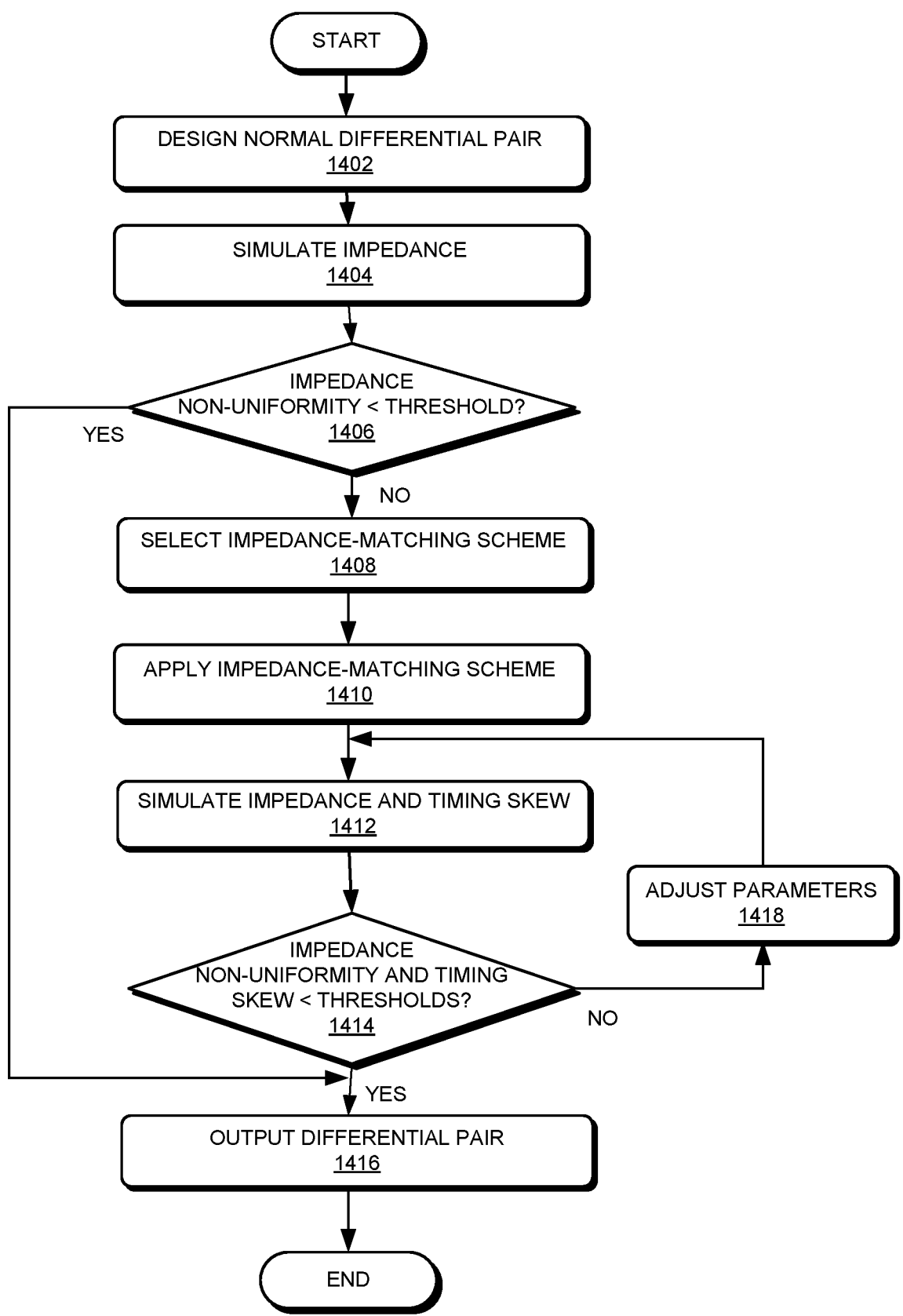
FIG. 14 presents a flowchart illustrating an exemplary process of controlling the impedance of a pair of differential transmission lines, according to one embodiment.

FIG. 14 presents a flowchart illustrating an exemplary process of controlling the impedance of a pair of differential transmission lines, according to one embodiment. During operation, a PCB design tool can be used to design a normal pair of differential transmission lines based on a number of design needs, such as total length and space constraints (operation 1402). The designed pair typically includes a number of normal uniform-width top-hat structures to compensate for timing skew arising from the length difference between the two traces.

The PCB design tool can also simulate the impedance non-uniformity along the length of the pair of differential transmission lines (operation 1404) and determine if such non-uniformity is below a predetermined threshold (operation 1406). Depending on the application (e.g., the operating frequency), the threshold can be set to different values. For high-frequency PCB designs, the threshold value can be much smaller (e.g., less than one ohm). In one embodiment, a small amount of non-uniformity below the threshold can be tolerated and the system outputs the normal pair of differential transmission lines (operation 1416). If the non-uniformity is above the threshold, the system can select an impedance-matching scheme (operation 1408). Various impedance-matching schemes can be implemented, including manipulating the shape of the top-hat structures, the shape of the signal trace without the top-hat structures, and a combination thereof.

Subsequently, the system applies the impedance-matching scheme (operation 1410). For example, the design tool can modify the shape of the top-hat structures, the shape of the signal trace without the top-hat structures, or both. As discussed before, the width of the "top" portion of the top-hat structures can be determined based on the impedance non-uniformity. The system can simulate the impedance non-uniformity and the timing skew of the modified pair (operation 1412). In some embodiments, full-wave simulations can be performed to determine the impedance non-uniformity and the timing skew. If both the impedance non-uniformity and the timing skew are below the predetermined threshold values (operation 1414), the system outputs the modified pair (operation 1416). Otherwise, the system adjusts the parameters used for impedance matching and timing-skew compensation, including the amount of modification to the shape of the top-hat structures or the other trace (operation 1418) and runs the simulation again (operation 1412).

Figure 15:
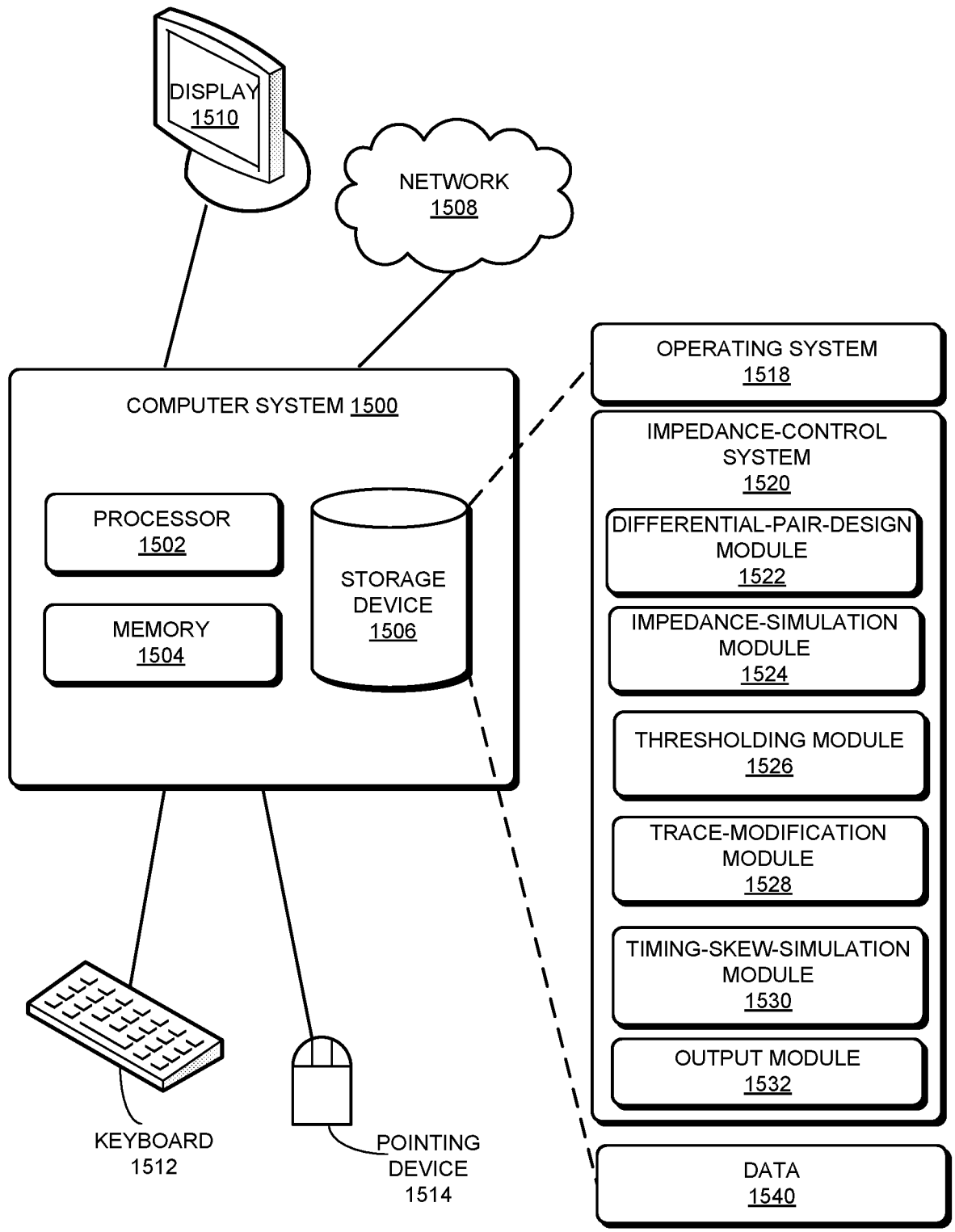
FIG. 15 illustrates an exemplary computer system that facilitates controlling the impedance of a pair of differential transmission lines, according to one embodiment.

FIG. 15 illustrates an exemplary computer system that facilitates controlling the impedance of a pair of differential transmission lines, according to one embodiment. Computer system 1500 includes a processor 1502, a memory 1504, and a storage device 1506. Computer system 1500 can be coupled to a display device 1510, a keyboard 1512, and a pointing device 1514, and can also be coupled via one or more network interfaces to network 1508. Storage device 1506 can store an operating system 1518, an impedance-control system 1520, and data 1540.

Impedance-control system 1520 can include instructions, which when executed by computer system 1500 can cause computer system 1500 to perform methods and/or processes described in this disclosure. Impedance-control system 1520 can include instructions for designing a pair of differential transmission lines (differential-pair-design module 1522), instructions for simulating the impedance profile of the pair (impedance-simulation module 1524), instructions for thresholding the impedance and the timing skew (thresholding module 1526), instructions for modifying the metal traces, including the true-signal and/or complementary traces (trace-modification module 1528), instructions for simulating the timing skew (timing-skew-simulation module 1530), and instructions for outputting the impedance-controlled pair of differential transmission lines (output module 1532).

One embodiment provides a printed circuit board (PCB). The PCB can include one or more metal layers and at least a pair of differential transmission lines. The pair of differential transmission lines can include a first transmission line and a second transmission line. The first transmission line can include a plurality of timing-skew-compensation structures, and a respective timing-skew-compensation structure of the first transmission line or a corresponding segment of the second transmission line adjacent to the timing-skew-compensation structure has a non-uniform width.

In a variation on this embodiment, the timing-skew-compensation structure can include a top-hat structure, and a segment of the top-hat structure that is substantially parallel to the second transmission line is widened compared with a different segment of the first transmission line.

In a further variation, a width of the widened segment is determined based at least on an impedance non-uniformity along the pair of differential transmission lines, and the width of the widened segment is determined such that the impedance non-uniformity is below a predetermined threshold.

In a further variation, a position of a center line of the widened segment is determined based at least on an amount of timing skew associated with the pair of differential transmission lines, and a total amount of timing skew is below a predetermined threshold.

In a variation on this embodiment, the corresponding segment of the second transmission line adjacent to the timing-skew-compensation structure has a convex edge on at least one side, thereby causing the corresponding segment of the second transmission line to be wider than a straight segment of the second transmission line.

In a further variation, the convex edge is part of an elliptically-shaped segment overlapping the corresponding segment of the second transmission line. An aspect ratio of the ellipse is determined based at least on an impedance non-uniformity along the pair of differential transmission lines, and the aspect ratio is determined such that the impedance non-uniformity is below a predetermined threshold.

In a variation on this embodiment, the corresponding segment of the second transmission line adjacent to the timing-skew-compensation structure has a portion extruding toward the first transmission line, causing the corresponding segment of the second transmission line to be widened compared with a straight segment of the second transmission line.

In a further variation, the extruded portion is trapezoid-shaped, and a height of the trapezoid shape is determined based at least on an impedance non-uniformity along the pair of differential transmission lines. The height can be determined such that the impedance non-uniformity is below a predetermined threshold.

In a variation on this embodiment, both the timing-skew-compensation structure of the first transmission line and the corresponding segment of the second transmission line are widened symmetrically to decrease a local impedance.

In a variation on this embodiment, an amount of timing skew caused by the non-uniform width of the timing-skew-compensation structure of the first transmission line and an amount of timing skew caused by the non-uniform width of the corresponding segment of the second transmission line substantially compensate for each other.

One embodiment provides a pair of differential transmission lines on a PCB. The pair of differential transmission lines can include a first metallic trace and a second metallic trace. The first metallic trace can include a plurality of timing-skew-compensation structures, and a respective timing-skew-compensation structure of the first metallic trace or a corresponding segment of the second metallic trace adjacent to the timing-skew-compensation structure has a non-uniform width.

One embodiment provides a system for designing a pair of differential transmission lines on a PCB. During operation, the system generates an initial design of the pair of different transmission lines including a first transmission line and a second transmission line. Each of the designed first and second transmission lines has a uniform width, and the designed first transmission line includes a plurality of timing-skew-compensation structures. The system performs a simulation to determine an impedance non-uniformity along the pair of differential transmission lines and updates the initial design based on the simulated impedance non-uniformity. Updating the initial design can include modifying a timing-skew-compensation structure of the first transmission line or a corresponding segment of the second transmission line adjacent to the timing-skew-compensation structure such that the modified timing-skew-compensation structure or corresponding segment of the second transmission line has a non-uniform width.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, the methods and processes described above can be included in hardware modules or apparatus. The hardware modules or apparatus can include, but are not limited to, application-specific integrated circuit (ASIC) chips, field-programmable gate arrays (FPGAs), dedicated or shared processors that execute a particular software module or a piece of code at a particular time, and other programmable-logic devices now known or later developed. When the hardware modules or apparatus are activated, they perform the methods and processes included within them.

The foregoing descriptions of embodiments have been presented for purposes of illustration and description only. They are not intended to be exhaustive or to limit the scope of this disclosure to the forms disclosed. Accordingly, many modifications and variations will be apparent to practitioners skilled in the art.

What is claimed is:

1. A printed circuit board (PCB), comprising:
   one or more layers; and
   at least a pair of differential transmission lines comprising a first transmission line and a second transmission line;
   wherein the first transmission line comprises a plurality of straight segments and a plurality of modified top-hat structures, wherein a respective straight segment has a first uniform width, and wherein a respective modified top-hat structure has a second uniform width that is greater than the first uniform width; and
   wherein the second transmission line comprises a plurality of first straight segments and a plurality of second straight segments, wherein a respective second straight segment of the second transmission line is wider than a respective first straight segment of the second transmission line, wherein the respective first straight segment of the second transmission line is positioned adjacent to a straight segment of the first transmission line, and wherein the respective second straight segment of the second transmission line is positioned adjacent to a modified top-hat structure of the first transmission line.

2. The PCB of claim 1, wherein the first transmission line further comprises a second plurality of modified top-hat structures, wherein a respective modified top-hat structure of the second plurality of modified top-hat structures comprises a widened top segment, wherein a position of a center line of the widened top segment is determined based at least on an amount of timing skew associated with the pair of differential transmission lines, and wherein a total amount of timing skew is below a predetermined threshold.

3. The PCB of claim 2, wherein the second transmission line comprises a corresponding modified segment adjacent to the respective modified top-hat structure of the second plurality of modified top-hat structures, and wherein the modified segment has a convex edge on at least one side such that the modified segment of the second transmission line is wider than the respective first straight segment of the second transmission line.

4. The PCB of claim 3, wherein the modified segment of the second transmission line has a portion extruding toward the first transmission line.

5. The PCB of claim 4, wherein the extruded portion is trapezoid-shaped, and wherein a height of the trapezoid shape is determined based at least on an impedance non-uniformity along the pair of differential transmission lines, and wherein the height is determined such that the impedance non-uniformity is below a predetermined threshold.

6. The PCB of claim 3, wherein the modified segment comprises an elliptically-shaped segment having a predetermined aspect ratio, wherein the aspect ratio of the elliptically-shaped segment is determined based at least on an impedance non-uniformity along the pair of differential transmission lines, and wherein the aspect ratio is determined such that the impedance non-uniformity is below a predetermined threshold.

7. The PCB of claim 3, wherein an amount of timing skew caused by the widened top segment of the first transmission line and an amount of timing skew caused by the modified segment of the second transmission line substantially compensate for each other.

8. The PCB of claim 2, wherein the widened top segment of the respective modified top-hat structure of the second plurality of modified top-hat structures is widened.

9. The PCB of claim 1, wherein the second uniform width of the modified top-hat structure is determined based at least on an impedance non-uniformity along the pair of differential transmission lines, and wherein the second uniform width is determined such that the impedance non-uniformity is below a predetermined threshold.

10. A pair of differential transmission lines on a printed circuit board (PCB), comprising:
    a first metallic trace; and
    a second metallic trace;
    wherein the first metallic trace comprises a plurality of straight segments and a plurality of modified top-hat structures, wherein a respective straight segment has a first uniform width, and wherein a respective modified top-hat structure has a second uniform width that is greater than the first uniform width; and
    wherein the second metallic trace comprises a plurality of first straight segments and a plurality of second straight segments, wherein a respective second straight segment of the second metallic trace is wider than a respective first straight segment of the second metallic trace, wherein the respective first straight segment of the second metallic trace is positioned adjacent to a straight segment of the first metallic trace, and wherein the respective second straight segment of the second metallic trace is positioned adjacent to a modified top-hat structure of the first metallic trace.

11. The pair of differential transmission lines of claim 10, wherein the first metallic trace further comprises a second plurality of modified top-hat structures, wherein a respective modified top-hat structure of the second plurality of modified top-hat structures comprises a widened top segment, wherein a position of a center line of the widened top segment is determined based at least on an amount of timing skew associated with the pair of differential transmission lines, and wherein a total amount of timing skew is below a predetermined threshold.

12. The pair of differential transmission lines of claim 11, wherein the second metallic trace comprises a corresponding modified segment adjacent to the respective modified top-hat structure of the second plurality of modified top-hat structures, and wherein the modified segment has a convex edge on at least one side such that the modified segment of the second metallic trace is wider than the respective first straight segment of the second metallic trace.

13. The pair of differential transmission lines of claim 12, wherein the modified segment of the second metallic trace has a portion extruding toward the first metallic trace.

14. The pair of differential transmission lines of claim 13, wherein the extruded portion is trapezoid-shaped, and wherein a height of the trapezoid shape is determined based at least on an impedance non-uniformity along the pair of differential transmission lines, and wherein the height is determined such that the impedance non-uniformity is below a predetermined threshold.

15. The pair of differential transmission lines of claim 12, wherein the modified segment comprises an elliptically-shaped segment having a predetermined aspect ratio, wherein the aspect ratio of the elliptically-shaped segment is determined based at least on an impedance non-uniformity along the pair of differential transmission lines, and wherein the aspect ratio is determined such that the impedance non-uniformity is below a predetermined threshold.

16. The pair of differential transmission lines of claim 12, wherein an amount of timing skew caused by the widened top segment and an amount of timing skew caused by the modified segment of the second metallic trace substantially compensate for each other.

17. The pair of differential transmission lines of claim 11, wherein the widened top segment of the respective modified top-hat structure of the second plurality of modified top-hat structures.

18. The pair of differential transmission lines of claim 10, wherein the second uniform width of the modified top-hat structure is determined based at least on an impedance non-uniformity along the pair of differential transmission lines, and wherein the second uniform width of the modified top-hat structure is determined such that the impedance non-uniformity is below a predetermined threshold.

* * * * *